US012614701B2

(12) United States Patent
Sarode et al.

(10) Patent No.: US 12,614,701 B2
(45) Date of Patent: Apr. 28, 2026

(54) SUBSTRATE PROCESSING CHAMBER WITH PLASMA CONFINEMENT

(71) Applicant: Applied Materials, Inc., Santa Clara, CA (US)

(72) Inventors: Yogananda Vishwanath Sarode, Bangalore (IN); Anand Kumar, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 54 days.

(21) Appl. No.: 18/664,748

(22) Filed: May 15, 2024

(65) Prior Publication Data

US 2025/0357089 A1     Nov. 20, 2025

(51) Int. Cl.
*H01J 37/32*          (2006.01)
(52) U.S. Cl.
CPC . *H01J 37/32623* (2013.01); *H01J 2237/3323* (2013.01); *H01J 2237/3343* (2013.01)
(58) Field of Classification Search
None
See application file for complete search history.

(56) References Cited

U.S. PATENT DOCUMENTS 8,597,462 B2    12/2013  Brown et al.
2005/0241767 A1*  11/2005  Ferris ................ H01J 37/32633
                                                  156/345.35

2008/0110567 A1   5/2008  Miller et al.
2016/0163569 A1   6/2016  Long et al.
2018/0061618 A1   3/2018  Nichols et al.
2021/0343508 A1*  11/2021  Nguyen .............. C23C 16/4412
2023/0063007 A1   3/2023  Holland et al.
2023/0369026 A1   11/2023  Kimball et al.
2024/0395510 A1*  11/2024  Amikura .......... H01J 37/32633
2024/0429033 A1*  12/2024  Koshimizu ....... H01J 37/32633

FOREIGN PATENT DOCUMENTS

CN          114639585 A      6/2022

OTHER PUBLICATIONS

PCT International Search Report and Written Opinion for PCT/US2025/025420 dated Jul. 31, 2025.

* cited by examiner

*Primary Examiner* — Kenneth B Wells

(74) *Attorney, Agent, or Firm* — Moser Taboada

(57)          ABSTRACT

A plasma confinement screen system for a process chamber includes an inner plasma screen having an inner annular body with a central opening, the annular body including a plurality of first openings; and an outer plasma screen having an outer annular body with a central opening surrounding the inner plasma screen, the outer annular body including a plurality of second openings, wherein the outer plasma screen is configured for vertical movement relative to the inner plasma screen.

18 Claims, 7 Drawing Sheets

142

142

SUBSTRATE PROCESSING CHAMBER WITH PLASMA CONFINEMENT

FIELD

Embodiments of the present disclosure generally relate to an apparatus for substrate processing, and more particularly, to substate processing chambers.

BACKGROUND

Semiconductor substrate materials, such as silicon wafers, are often processed in vacuum chambers that are configured to perform plasma processes, such as sputter deposition, plasma-enhanced chemical vapor deposition (PECVD), resist strip, and plasma etch.

One metric for some plasma processes is deposition or etch uniformity of process results on a substrate surface as well as uniformity of process results across a series of substrates processed with nominally the same input parameters. During plasma processing a plasma cloud is generated above a substrate being processed. Unconfined plasma may cause an unstable processing environment and the plasma cloud may scatter in the chamber and not be effectively utilized for substrate processing, leading to non-uniform process results.

In some process chambers configured for plasma processing, a plasma screen may be used to confine the plasma to improve process uniformity. However, the inventors of the present disclosure have observed that while some plasma screens may help confine plasma in a vertical direction, those plasma screens are often not very effective at confining the plasma in a radial direction. Therefore, the inventors have provided a plasma screen that is effective at plasma confinement in both the vertical and radial directions.

SUMMARY

A process chamber and a plasma confinement screen system therefor are provided herein. In some embodiments a plasma confinement screen system for a process chamber includes an inner plasma screen having an inner annular body with a central opening, the annular body including a plurality of first openings; and an outer plasma screen having an outer annular body with a central opening surrounding the inner plasma screen, the outer annular body including a plurality of second openings, wherein the outer plasma screen is configured for vertical movement relative to the inner plasma screen.

In some embodiments, a process chamber for substrate processing includes a chamber body defining a substrate processing volume; a substrate support positioned in the substrate processing volume, the substrate support configured to support a substrate during plasma processing; a process kit surrounding the substrate support; and a plasma confinement screen system extending from the process kit. The plasma confinement screen system includes: an inner plasma screen having an inner annular body with a central opening, the annular body including a plurality of first openings; and an outer plasma screen having an outer annular body with a central opening surrounding the inner plasma screen, the outer annular body including a plurality of second openings, wherein the outer plasma screen is configured for vertical movement relative to the inner plasma screen.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
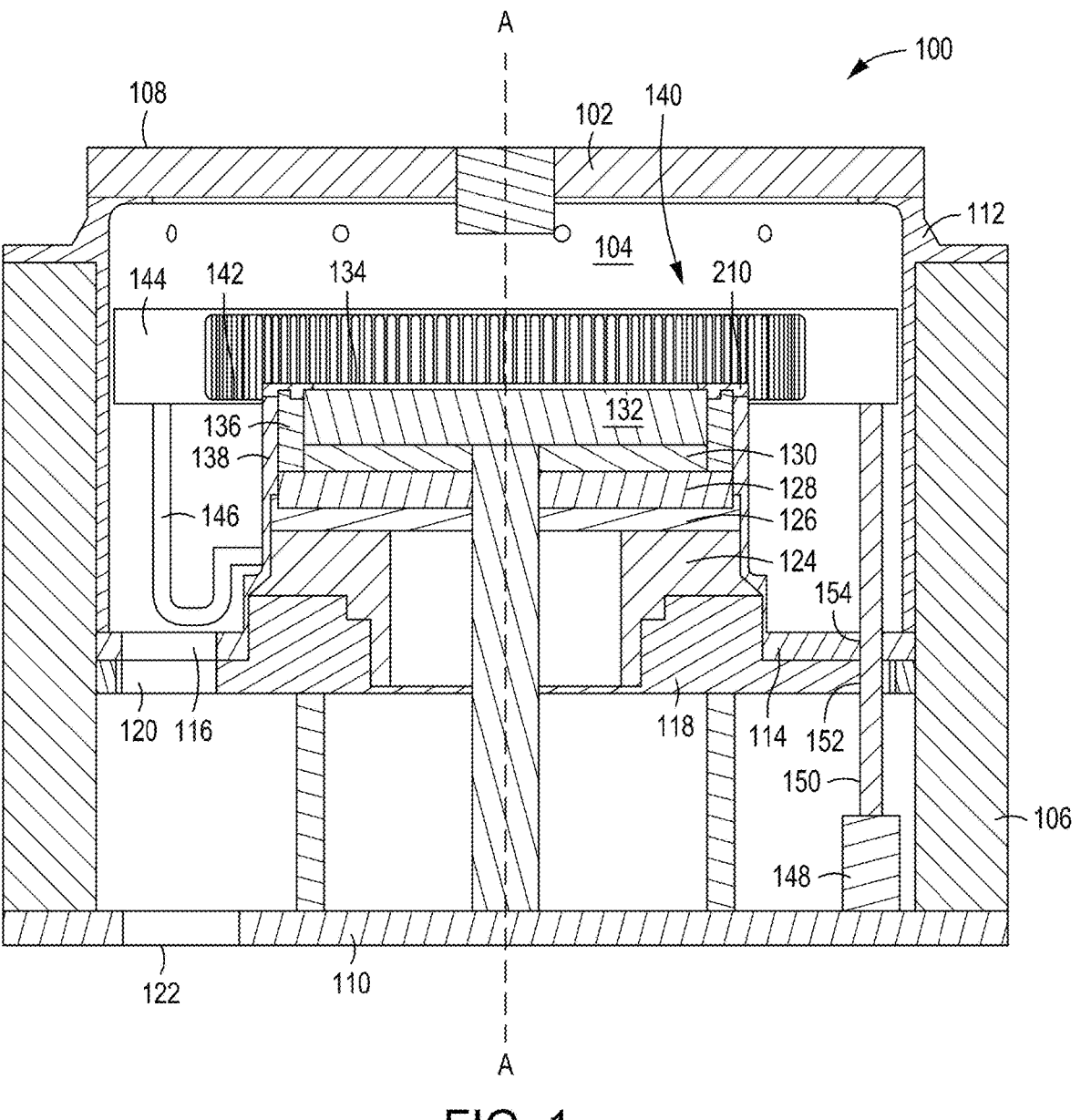
FIG. 1 is a cross-sectional view of a process chamber according to some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a process chamber and a plasma confinement screen system usable therefor are provided herein. The plasma confinement screen system may be configured to surround the inner periphery of a confined chamber volume in which plasma is formed during substrate processing in the process chamber. The plasma confinement screen system may comprise a plurality of plasma confinement screens that enable vertical and radial control of a plasma cloud in the process chamber to avoid scattered plasma during substrate processing in the process chamber. As described in greater detail herein the plasma confinement screens may be configured to move vertically relative to one another as a tuning knob for plasma confinement tuning.

FIG. 1 is a cross sectional view of a process chamber 100 according to some embodiments of the present disclosure. The process chamber 100 may be configured for performing plasma processing of substrates (e.g., semiconductor wafers) in the process chamber. In some embodiments, and as shown in FIG. 1, the process chamber 100 may include a chamber body 102 defining a substrate processing volume 104. In some embodiments, the chamber body 102 may include a sidewall 106, a lid 108, and a base 110. The lid 108 may have one or more inlet openings to permit a flow of process gases used for plasma processing into the substrate processing volume 104. The flow of process gases may be controlled by one or more flow control devices (not shown), such as mass flow controllers. A portion of the chamber body 102 may be lined by an upper support liner 112 and a lower liner 114 which may have equally spaced exhaust holes 116. In some embodiments, the exhaust holes 116 may be axisymmetric with respect to a central vertical axis A. In some embodiments, three exhaust holes 116 are present. In some embodiments, a slit valve cutout (not shown) may be formed in at least one of the upper support liner 112 or the sidewall 106 to permit a substrate to enter and exit the substrate processing volume 104.

A chassis 118 may be fixed to the chamber body 102 between the lid 108 and the base 110 and may support the lower liner 114. The chassis 118 may have symmetrically spaced exhaust holes 120 that may be aligned with the exhaust holes 116 in the lower liner 114. The exhaust holes 116 and 120 may be used to direct gases from the substrate processing volume 104 downward toward one or more exhaust holes 122 in the base 110 of the chamber body 102. A vacuum pump (not shown) may be connected to the one or more exhaust holes 122 to maintain vacuum in the processing volume and to remove exhaust gases.

In some embodiments, and as shown in FIG. 1, the chassis 118 may support a support bowl 124, a ground plate 126, an insulator plate 128, an accessory plate 130, and a substrate support 132. The substrate support 132 is positioned in the substrate processing volume 104 and has a substrate support surface 134 configured to support a substrate (not shown). In some embodiments, a process kit 136 surrounds the substrate support surface 134 and may be supported by the substrate support 132. In some embodiments and as shown in FIG. 1, a cathode sleeve 138 may extend around the process kit 136 and may be fixed to the ground plate 126, such as with fasteners.

In some embodiments and as shown in FIG. 1, the process chamber 100 may include a plasma confinement screen system 140 extending from the process kit 136. In some embodiments, and as shown in FIGS. 1-3, the plasma confinement screen system 140 may include an inner plasma screen 142 fixed to the cathode sleeve 138 and an outer plasma screen 144 that is movable (e.g., vertically) with respect to the inner plasma screen 142. In some embodiments, and as shown in FIG. 1, one or more metal straps 146 may be connected between the outer plasma screen 144 and a ground location, such as the cathode sleeve 138, the sidewall 106, or chassis 118. In some embodiments, and as shown in FIG. 1, the outer plasma screen 144 may be radially spaced from the sidewall 106 of the chamber body 102.

The outer plasma screen 144 may be configured for vertical movement relative to the inner plasma screen 142. By moving the outer plasma screen 144 relative to the inner plasma screen 142, the vertical and radial confinement of plasma can be tuned during plasma processing in the substrate processing volume 104. In some embodiments, and as shown in FIGS. 1 and 2, the process chamber may include a plurality of actuators 148 with lift pins 150 connected to and supporting the outer plasma screen 144. Holes 152 and 154 may be provided in the chassis 118 and the lower liner 114, respectively, to permit passage of the lift pins 150. The actuators 148 are configured to extend and retract the lift pins 150 to raise and lower the outer plasma screen 144 relative to the inner plasma screen 142, as described in greater detail hereinbelow.

Figure 4:
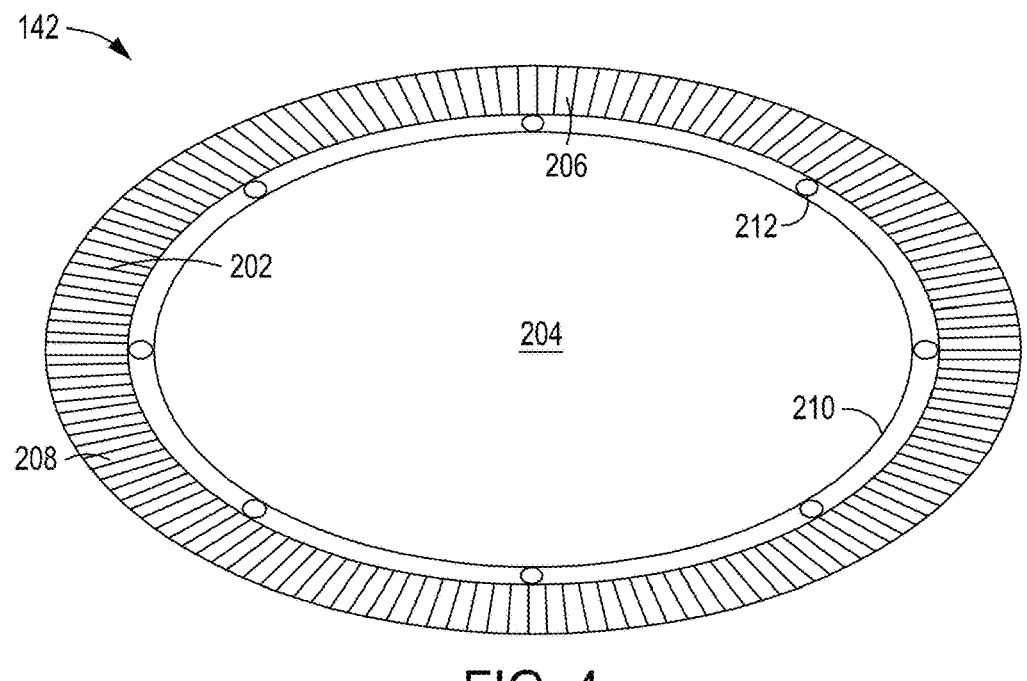
FIG. 4 is an isometric view of an inner plasma screen shown in FIGS. 2A-3B from a top and front side of the inner plasma screen.
Figure 5:
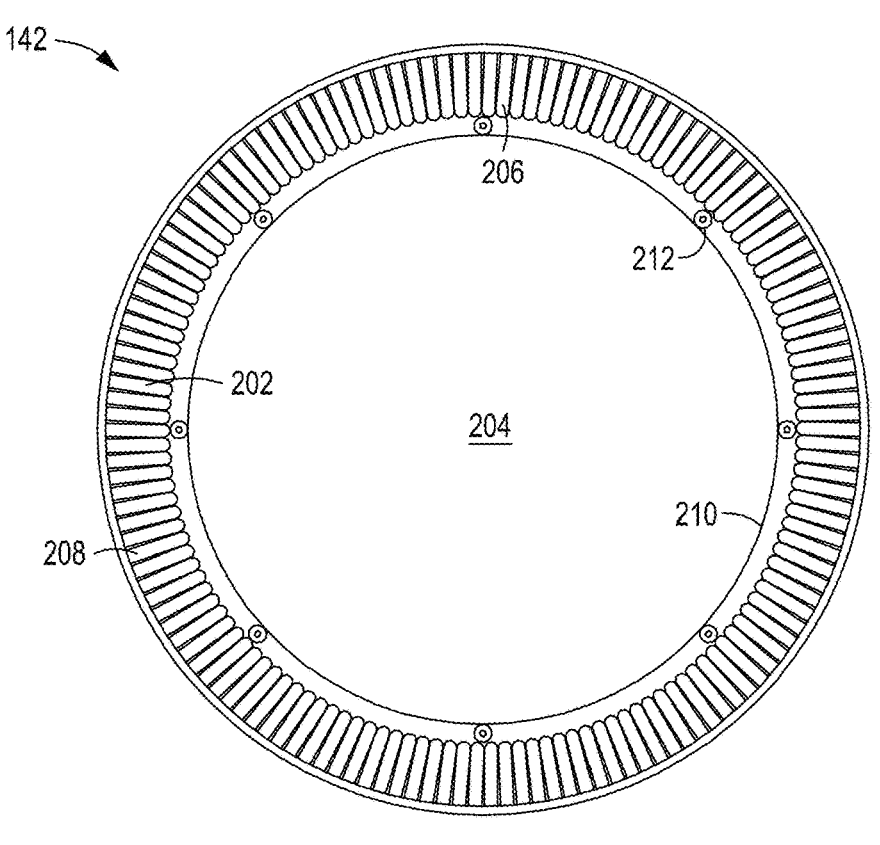
FIG. 5 is a top view of the inner plasma screen shown in FIG. 4.

In some embodiments and as shown in FIGS. 4 and 5, the inner plasma screen 142 may have an inner annular body 202 with a central opening 204. The inner annular body 202 may include a plurality of first openings 206, which may be spaced equally about the inner annular body 202. The first openings 206 may be elongated and/or may extend radially. The inner plasma screen 142 may have an outer edge 208 and an inner mounting flange 210 with mounting holes 212 configured to fix the inner plasma screen 142 to the cathode sleeve 138. In some embodiments, and as shown in FIG. 1, the inner mounting flange 210 may be fixed to the cathode sleeve 138 with a plurality of fasteners, such as screws. In some embodiments, the inner annular body 202 may be planar.

Figure 6:
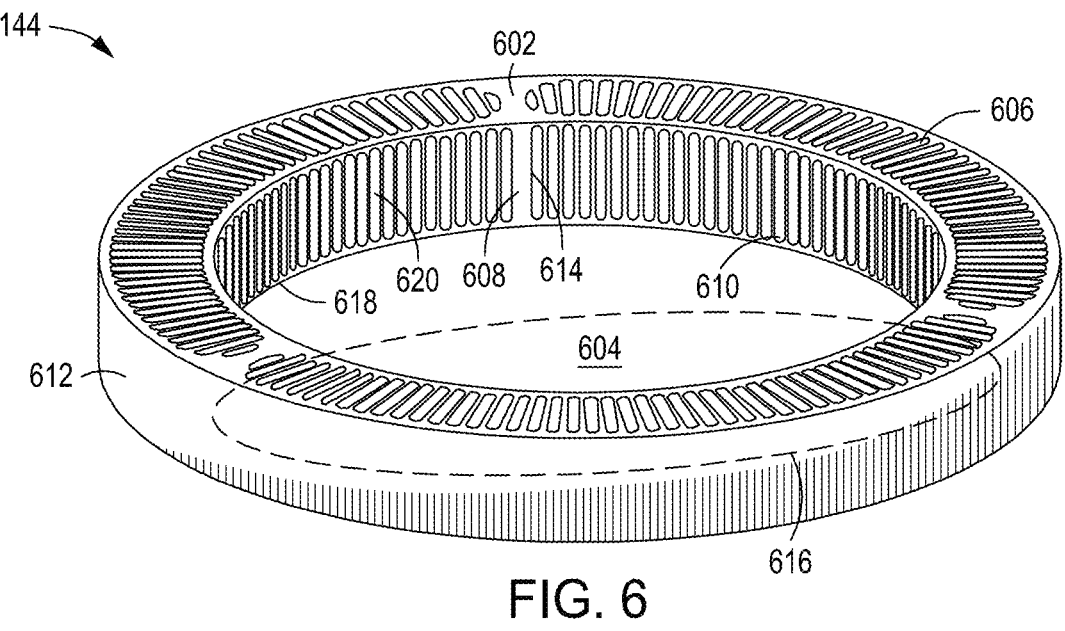
FIG. 6 is an isometric view of an outer plasma screen shown in FIG. 2A-3B from a top and front side of the outer plasma screen.
Figure 7:
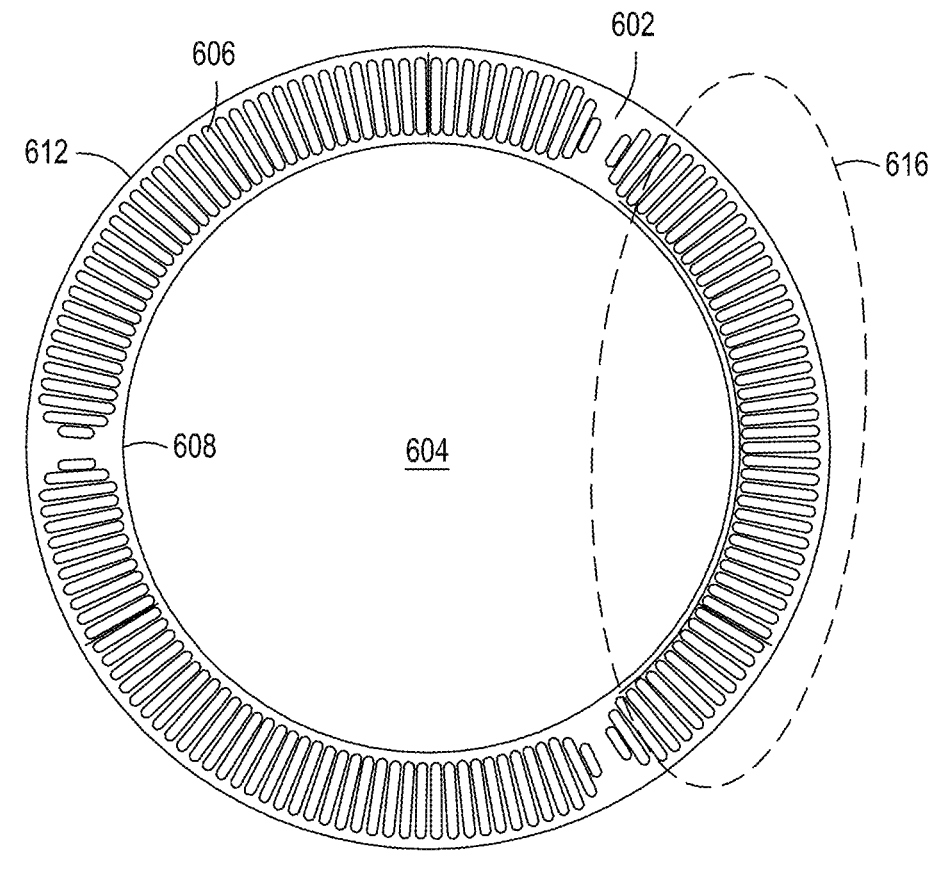
FIG. 7 is a top view of the outer plasma screen shown in FIG. 6.

In some embodiments, and as shown in FIGS. 6 and 7, the outer plasma screen 144 may have an outer annular body 602 with a central opening 604. In some embodiments, the central opening 604 is configured to surround the inner plasma screen 142. In some embodiments, the outer annular body 602 may be planar. The outer annular body 602 may include a plurality of second openings 606, which may be spaced equally about the outer annular body 602. The second openings may be elongated and/or may extend radially.

Figure 2A:
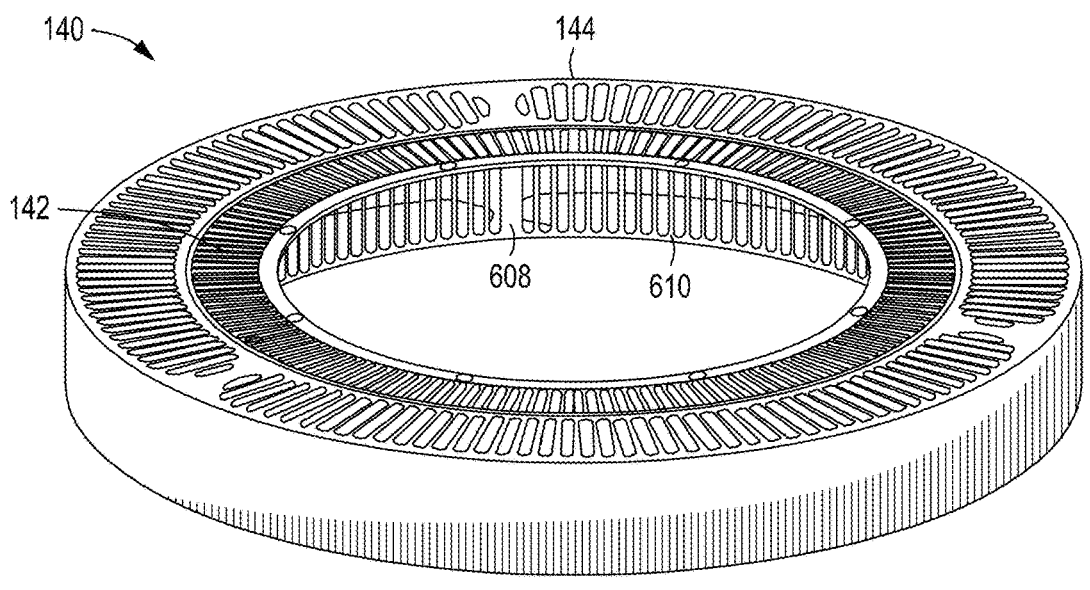
FIG. 2A is an isometric view of a plasma confinement screen system from a top and front side thereof according to some embodiments of the present disclosure.
Figure 2B:
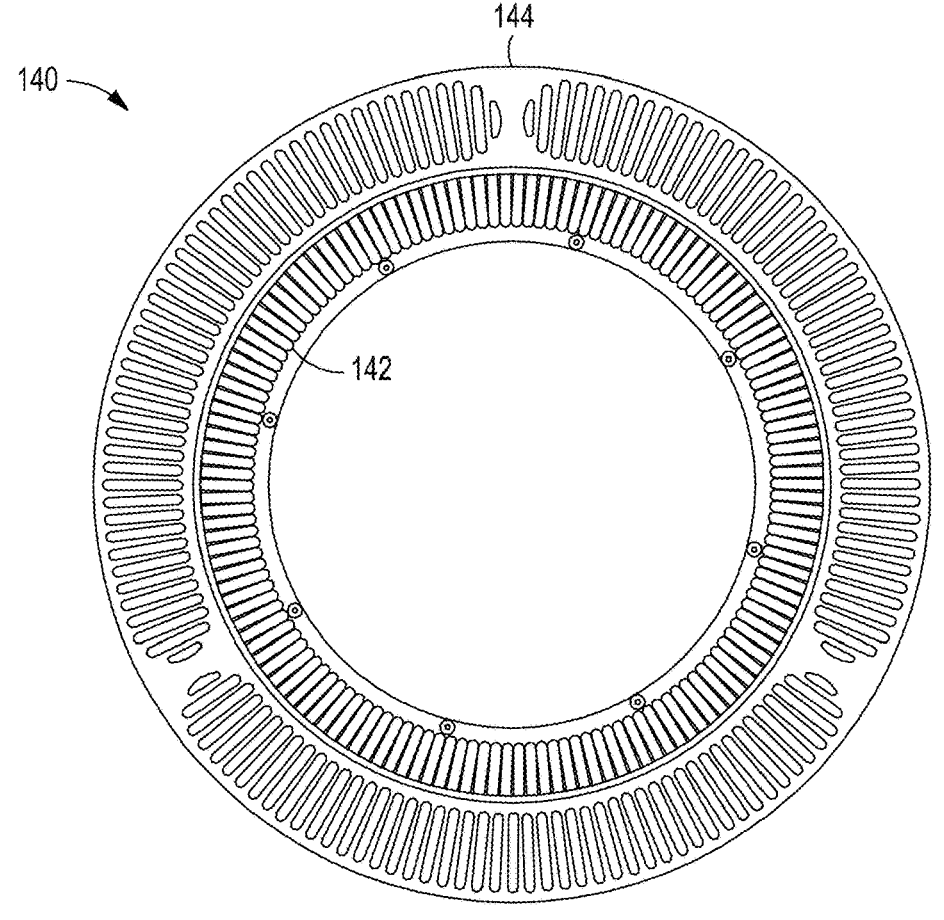
FIG. 2B is a top view of the plasma confinement screen system of FIG. 2A.
Figure 3A:
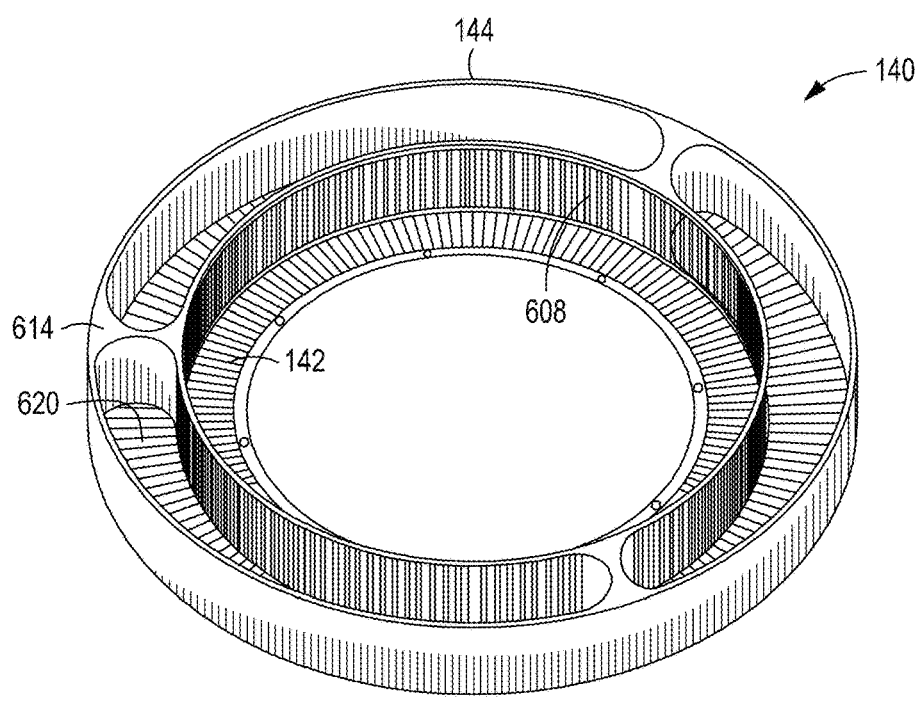
FIG. 3A is an isometric view of a plasma confinement screen system from a bottom and front side thereof according to some embodiments of the present disclosure.
Figure 3B:
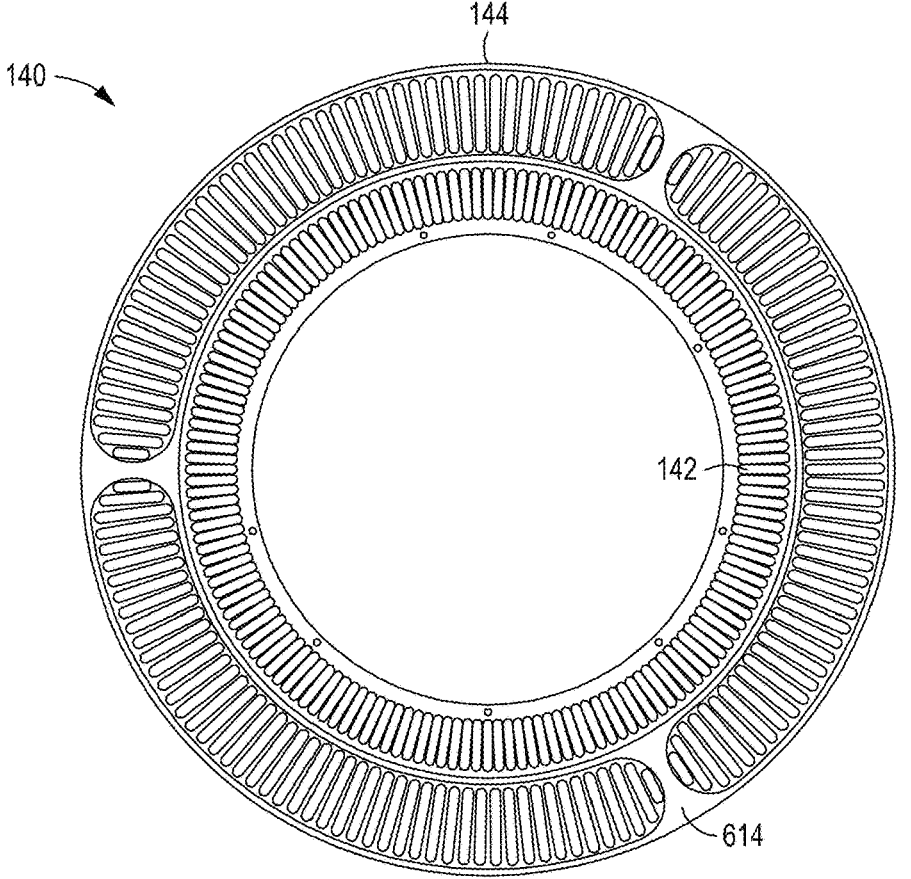
FIG. 3B is a bottom view of the plasma confinement screen system of FIG. 3A.

In some embodiments and as shown in FIGS. 2A, 3A, and 6, the outer plasma screen 144 may have an inner sidewall 608 having a plurality of third openings 610, which may be spaced equally about the inner sidewall 608. The inner sidewall 608 may extend from the outer annular body 602 to a lower edge 618. The third openings 610 may be elongated and/or may extend vertically. The inner sidewall 608 is a substantially vertical surface (+/−45 degrees with respect to axis A) that can provide radial confinement to a plasma cloud in the substrate processing volume 104.

Figure 11:
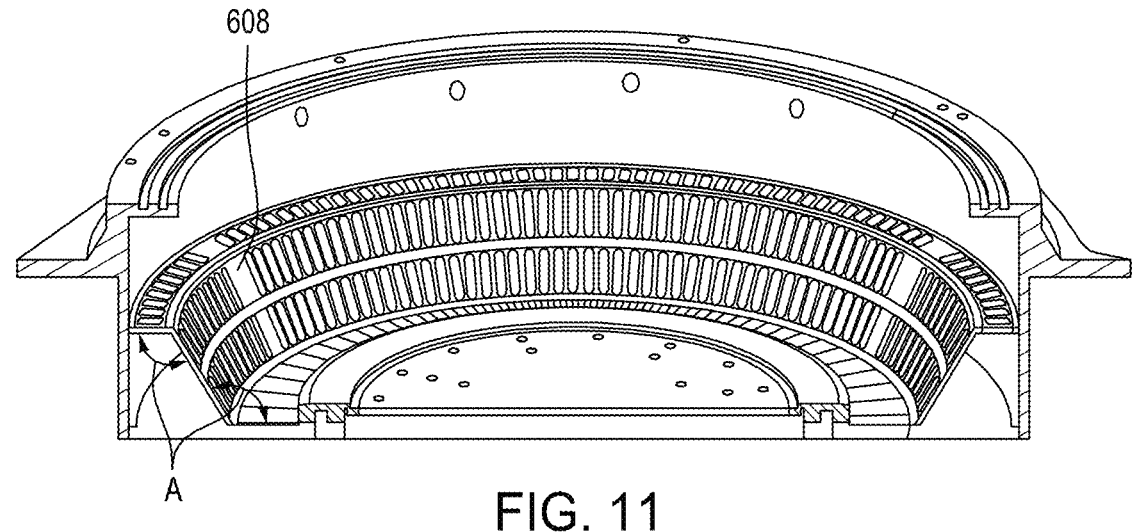
FIG. 11 is a partial isometric view of a process chamber according to some embodiments of the present disclosure.

In some embodiments and as shown in FIGS. 1 and 11, the outer plasma screen 144 may have a channel profile (e.g., u-shaped profile or v-shaped profile). In some embodiments, and as shown in FIGS. 2A and 3A, the inner sidewall 608 may extend perpendicular to the inner annular body 202 of the inner plasma screen 142 and perpendicular to the outer annular body 602 of the outer plasma screen 144. In some embodiments, and as shown in FIG. 11, the inner sidewall 608 may extend at an angle A (obtuse angle or acute angle) with respect to the inner annular body 202 and/or the outer annular body 602 that is not a right angle. In some embodiments, and as shown in FIG. 6 the outer plasma screen 144 may have an outer sidewall 612 that is solid.

In some embodiments, and as shown in FIG. 6, the outer plasma screen 144 may include a plurality of dividing walls 614 (three are shown in FIG. 6) extending radially from the inner sidewall 608 to the outer sidewall 612. The dividing walls 614 may be curved and/or tapered radially as shown in FIG. 6. In some embodiments, and as shown in FIG. 6, the plurality of dividing walls 614 may be spaced equidistantly from one another about the outer plasma screen. In some embodiments, the dividing walls 614 may be solid.

In some embodiments and as shown in FIG. 6, the second openings 606 may be arranged in equally sized groups 616 (three groups are shown in FIG. 6) spaced equidistantly from one another about the outer plasma screen 144. In some embodiments, and as shown in FIG. 6, the groups 616 may be separated from one another by the dividing walls 614. In some embodiments, and as shown in FIGS. 3A and 6, the outer plasma screen 144 may be divided by the dividing walls 614 into a plurality of chambers 620. In some embodiments, each chamber 620 and group 616 may be vertically aligned with exhaust holes 116, exhaust holes 120, and exhaust holes 122 to promote symmetric and balanced exhaust gas flow through the process chamber 100.

Figure 8:
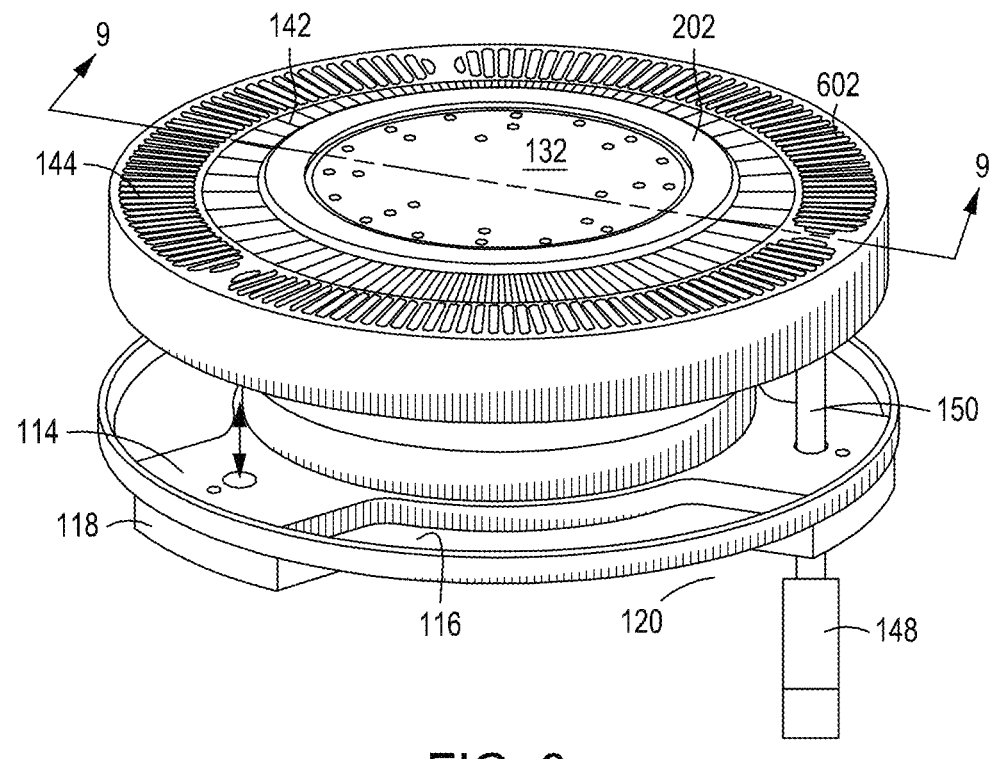
FIG. 8 is an isometric view of the process chamber of FIG. 1 from a top and front side of the process chamber and shown without the chamber body according to some embodiments of the present disclosure.
Figure 9:
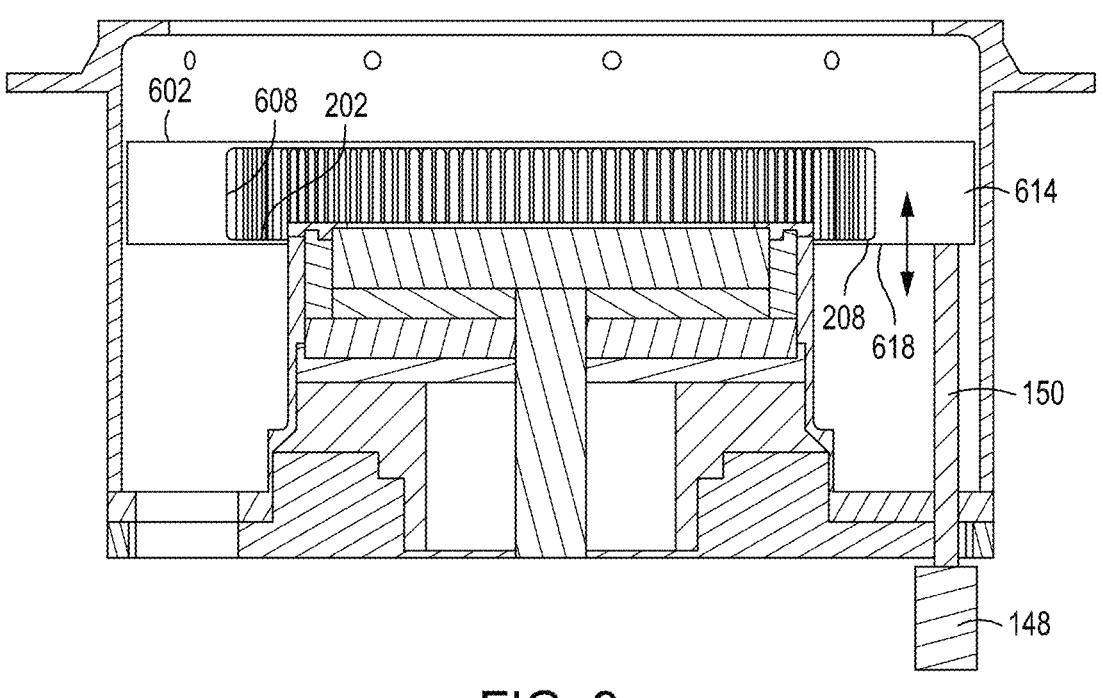
FIG. 9 is a partial cross-sectional view of the process chamber of FIG. 1 shown with the outer plasma confinement screen in a raised position.
Figure 10:
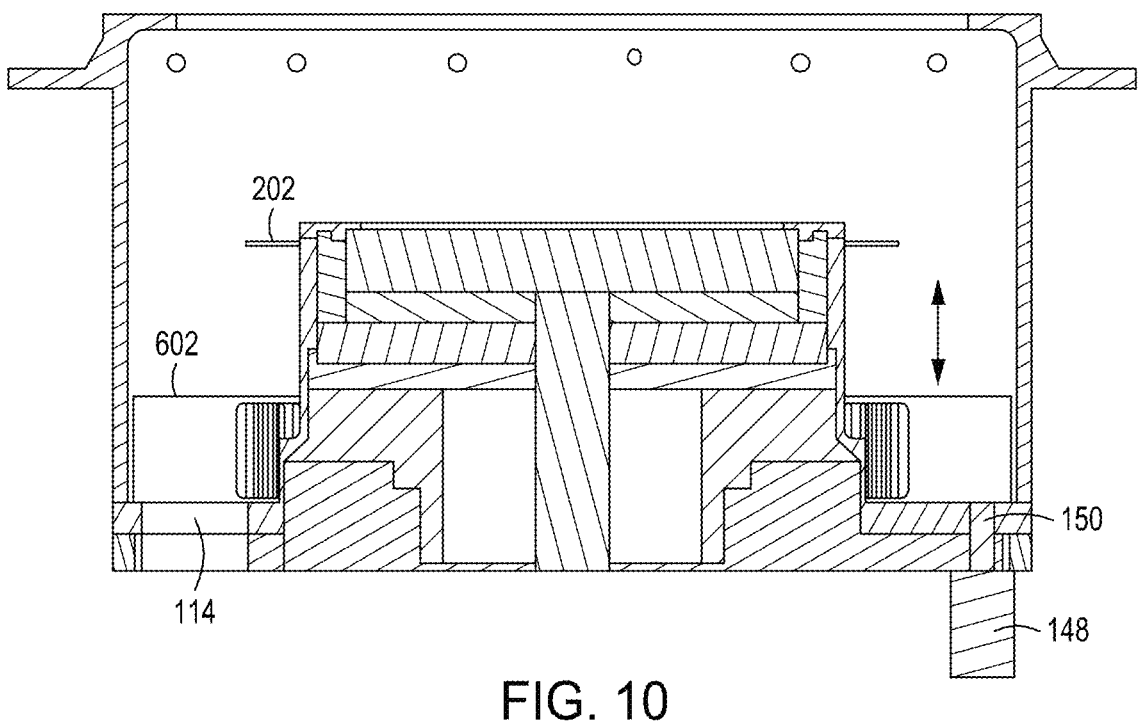
FIG. 10 is a partial cross-sectional view of the process chamber of FIG. 1 shown with the outer plasma confinement screen in a lowered position.

In some embodiments, and as shown in FIG. 8, the inner annular body 202 and the outer annular body 602 may be configured to extend parallel to one another. In some embodiments, and as shown in FIG. 9, the lift pins 150 may contact or connect to a portion (e.g., bottom) of the dividing walls 614 to support the outer annular body 602. As shown in FIGS. 1 and 8, the outer plasma screen 144 may be supported by the actuators 148 and lift pins 150 at a first position relative to the inner plasma screen 142. At the first position the inner annular body 202 and the outer annular body 602 are substantially coplanar with each other and with the substrate support surface 134 of the substrate support 132. In FIG. 9, the outer plasma screen 144 may be raised (e.g., from the first position) to a second position relative to the inner plasma screen 142 so that the inner annular body 202 is vertically spaced from (e.g., below) the outer annular body 602. In FIG. 9, the lower edge 618 of the inner sidewall 608 of the outer plasma screen 144 is at or near the same elevation as the outer edge 208 of the inner plasma screen 142. In FIG. 5, the outer plasma screen 144 may be lowered (e.g., from the first position) to a third position relative to the inner plasma screen 142 so that the inner annular body 202 is vertically spaced from (e.g., above) the outer annular body 602. At the third position, the outer plasma screen 144 may be spaced slightly vertically above the lower liner 114. Plasma processing may be performed with the outer plasma screen 144 at any position relative to the inner plasma screen 142. The relative positions between the outer plasma screen 144 and the inner plasma screen 142 may depend on plasma processing parameters used for processing a particular substrate.

Embodiments of a process chamber and a plasma confinement screen system usable therewith are described herein that can provide efficient plasma cloud confinement. The relative positioning of the inner plasma screen and the outer plasma screen enables adjustment or variation via a knob for process control. The uniformity of the plasma cloud increases with the introduction of the outer plasma screen that has at least partially vertical surfaces. Also, by reducing plasma scatter, energy efficiency of plasma processing can be improved.

While the foregoing is directed to embodiments of the present disclosure, other and further embodiments of the disclosure may be devised without departing from the basic scope thereof.

The invention claimed is:

1. A plasma confinement screen system for use in a process chamber, the system comprising:
a inner plasma screen having an inner annular body with a central opening, the annular body including a plurality of first openings; and
an outer plasma screen having an outer annular body with a central opening surrounding the inner plasma screen, the outer annular body including a plurality of second openings, wherein the outer plasma screen is configured for vertical movement relative to the inner plasma screen,
wherein the inner plasma screen has an inner mounting flange configured to fix the inner plasma screen to the process chamber.

2. The system of claim 1, wherein the outer plasma screen has an inner sidewall having a plurality of third openings.

3. The system of claim 2, wherein the inner sidewall extends perpendicular to the inner plasma screen.

4. The system of claim 2, wherein the inner sidewall extends at an obtuse angle with respect to the plasma screen.

5. The system of claim 2, wherein the outer plasma screen has an outer sidewall that is solid.

6. The system of claim 5, wherein the outer plasma screen includes a plurality of dividing walls extending radially from the inner sidewall to the outer sidewall, wherein the plurality of dividing walls are spaced equidistantly from one another about the outer plasma screen.

7. The system of claim 2, wherein the third openings are elongated.

8. The system of claim 2, wherein the second openings are arranged in equally sized groups spaced equidistantly from one another about the outer plasma screen.

9. The system of claim 1, wherein the outer plasma screen has a channel profile.

10. The system of claim 1, wherein the first openings and the second openings are elongated and extend radially.

11. A process chamber for substrate processing, the process chamber comprising:
a chamber body defining a substrate processing volume;
a substrate support positioned in the substrate processing volume, the substrate support configured to support a substrate during plasma processing;
a process kit surrounding the substrate support; and
a plasma confinement screen system extending from the process kit, the plasma confinement screen system comprising:
an inner plasma screen having an inner annular body with a central opening, the annular body including a plurality of first openings; and
an outer plasma screen having an outer annular body with a central opening surrounding the inner plasma screen, the outer annular body including a plurality of second openings, wherein the outer plasma screen is configured for vertical movement relative to the inner plasma screen,
wherein the inner plasma screen is fixed to the substrate support.

12. The process chamber of claim 11, wherein the outer plasma screen has an inner sidewall having a plurality of third openings.

13. The process chamber of claim 12, wherein the inner sidewall extends perpendicular to the inner plasma screen.

14. The process chamber of claim 12, wherein the inner sidewall extends at an obtuse angle with respect to the plasma screen.

15. The process chamber of claim 12, wherein the chamber body has a sidewall and the outer plasma screen has an outer sidewall that is spaced from the sidewall of the chamber body.

16. The process chamber of claim 15, wherein the outer plasma screen includes a plurality of dividing walls extending radially from the inner sidewall to the outer sidewall, wherein the plurality of dividing walls are spaced equidistantly from one another about the outer plasma screen.

17. The process chamber of claim 11, further comprising a plurality of actuators connected to the outer plasma screen, the actuators configured to move the outer plasma screen vertically relative to the inner plasma screen.

18. The process chamber of claim 11, further comprising a ground plate in the processing volume and a ground strap connected to the outer plasma screen and the ground plate.

\* \* \* \* \*